United States Patent
Spiro (10) Patent No.: US 11,680,702 B2
(45) Date of Patent: Jun. 20, 2023

(54) ELONGATED MODULAR HEAT SINK WITH COUPLED LIGHT SOURCE

(71) Applicant: EXPOSURE ILLUMINATION ARCHITECTS, INC., Scottsdale, AZ (US)

(72) Inventor: Daniel S. Spiro, Scottsdale, AZ (US)

(73) Assignee: EXPOSURE ILLUMINATION ARCHITECTS, INC., Scottsdale, AZ (US)

( * ) Notice: Subject to any disclaimer, the term of this patent is extended or adjusted under 35 U.S.C. 154(b) by 0 days.

(21) Appl. No.: 17/397,508

(22) Filed: Aug. 9, 2021

(65) Prior Publication Data

US 2021/0388977 A1 Dec. 16, 2021

Related U.S. Application Data

(63) Continuation-in-part of application No. 16/672,218, filed on Nov. 1, 2019, now Pat. No. 11,085,627, (Continued)

(51) Int. Cl.
| | |
|---|---|
| F21V 29/74 | (2015.01) |
| F21V 15/01 | (2006.01) |
| F21V 29/77 | (2015.01) |
| F21K 9/27 | (2016.01) |
| H05B 45/20 | (2020.01) |
| H05B 47/125 | (2020.01) |
| F21V 23/00 | (2015.01) |
| F21V 23/04 | (2006.01) |
| F21Y 115/10 | (2016.01) |
| H01L 33/64 | (2010.01) |

(Continued)

(52) U.S. Cl.
CPC .............. F21V 29/74 (2015.01); F21K 9/27 (2016.08); F21V 15/01 (2013.01); F21V 23/003 (2013.01); F21V 23/0478 (2013.01); F21V 29/773 (2015.01); H05B 45/20 (2020.01); H05B 47/125 (2020.01); *F21V 5/04* (2013.01); *F21Y 2103/10* (2016.08); *F21Y 2113/10* (2016.08); *F21Y 2115/10* (2016.08); *H01L 33/642* (2013.01)

(58) Field of Classification Search
CPC ....... F21V 15/01; F21V 29/74; F21Y 2115/10
See application file for complete search history.

(56) References Cited

U.S. PATENT DOCUMENTS

| | | |
|---|---|---|
| 6,428,183 B1 | 8/2002 | McAlpin |
| 7,959,319 B2 | 6/2011 | Chien |

(Continued)

FOREIGN PATENT DOCUMENTS

| | | |
|---|---|---|
| CN | 103244916 | 8/2013 |
| DE | 202011003828 U1 | 5/2011 |

(Continued)

OTHER PUBLICATIONS

Machine Translation of KR 20120-0021050 (Year: 2012).*

(Continued)

*Primary Examiner* — Leah Simone Macchiarolo
(74) *Attorney, Agent, or Firm* — Xsensus LLP (57) ABSTRACT

An elongated modular heat sink array having through power and/or data flowing from end to end powering and/or communicating with externally mounted coupled electronic devices.

21 Claims, 7 Drawing Sheets

Related U.S. Application Data which is a continuation-in-part of application No. PCT/US2019/033152, filed on May 20, 2019, which is a continuation of application No. 16/019,329, filed on Jun. 26, 2018, now Pat. No. 10,502,407.

(60) Provisional application No. 62/674,431, filed on May 21, 2018.

(51) Int. Cl.
    *F21V 5/04*           (2006.01)
    *F21Y 103/10*       (2016.01)
    *F21Y 113/10*       (2016.01)

(56) References Cited

U.S. PATENT DOCUMENTS

| | | | |
|---|---|---|---|
| 8,246,209 B2 | 8/2012 | Lai | |
| 8,287,144 B2 | 10/2012 | Pedersen | |
| 8,408,742 B2 | 4/2013 | Tran | |
| 8,419,223 B2 | 4/2013 | Withers | |
| 8,454,192 B2 * | 6/2013 | Rouse | F21S 8/031 362/225 |
| 8,864,511 B2 * | 10/2014 | Shimizu | F21V 23/006 439/226 |
| 8,899,778 B2 | 12/2014 | Yang | |
| 8,998,441 B2 * | 4/2015 | Kim | F21V 29/76 362/373 |
| 9,267,650 B2 | 2/2016 | Simon | |
| 9,574,717 B2 | 2/2017 | Scapa | |
| 9,644,800 B2 | 5/2017 | Purdy | |
| 9,644,828 B1 * | 5/2017 | May | F21V 23/02 |
| 9,846,272 B2 | 12/2017 | Dau | |
| 10,047,943 B2 * | 8/2018 | Storey | F21V 29/56 |
| 10,125,946 B2 | 11/2018 | Meerbeek | |
| 10,203,103 B2 | 2/2019 | Bendtsen et al. | |
| 10,378,742 B1 | 8/2019 | Rao | |
| 10,458,638 B1 | 10/2019 | Tirosh | |
| 10,551,046 B1 | 2/2020 | Tang | |
| 10,845,034 B2 | 11/2020 | Nichols | |
| 11,432,477 B2 * | 9/2022 | Wu | F21S 4/28 |
| 2002/0167282 A1 | 11/2002 | Kirkpatrick et al. | |
| 2008/0037239 A1 | 2/2008 | Thomas | |
| 2008/0158870 A1 | 7/2008 | Sun et al. | |
| 2008/0314944 A1 | 12/2008 | Tsai | |
| 2009/0190350 A1 | 7/2009 | Tseng | |
| 2010/0002426 A1 | 1/2010 | Wu | |
| 2010/0079075 A1 * | 4/2010 | Son | F21V 17/104 362/249.02 |
| 2010/0296285 A1 | 11/2010 | Chemel et al. | |
| 2010/0301773 A1 | 12/2010 | Chemel | |
| 2010/0309652 A1 | 12/2010 | Shen et al. | |
| 2011/0075416 A1 | 3/2011 | Chou | |
| 2011/0141723 A1 | 6/2011 | Lai | |
| 2011/0141724 A1 | 6/2011 | Erion | |
| 2011/0235318 A1 | 9/2011 | Simon | |
| 2011/0286208 A1 | 11/2011 | Chen | |
| 2011/0304270 A1 | 12/2011 | Scarpelli | |
| 2012/0026729 A1 | 2/2012 | Sanchez | |
| 2012/0201024 A1 | 8/2012 | Van De Ven et al. | |
| 2012/0212953 A1 | 8/2012 | Bloom | |
| 2012/0218757 A1 | 8/2012 | Gill | |
| 2013/0003346 A1 | 1/2013 | Letoquin | |
| 2013/0039041 A1 | 2/2013 | Yeh | |
| 2013/0050998 A1 | 2/2013 | Chu | |
| 2013/0093325 A1 * | 4/2013 | Scarpelli | H05B 45/36 315/85 |
| 2013/0119896 A1 | 5/2013 | Fukano | |
| 2013/0148351 A1 | 6/2013 | Georgitsis et al. | |
| 2013/0182422 A1 * | 7/2013 | Guilmette | F21V 7/24 362/217.05 |
| 2014/0063795 A1 | 3/2014 | Hoffmann et al. | |
| 2014/0126190 A1 | 5/2014 | Dixon | |
| 2014/0313711 A1 | 10/2014 | Hwu | |
| 2015/0116997 A1 | 4/2015 | Tappert et al. | |
| 2015/0211710 A1 | 7/2015 | Speier | |
| 2015/0300617 A1 | 10/2015 | Katona | |
| 2015/0345743 A1 | 12/2015 | Trincia | |
| 2016/0201883 A1 * | 7/2016 | Sorensen | H01R 25/14 362/225 |
| 2016/0323974 A1 | 11/2016 | Spiro et al. | |
| 2017/0023193 A1 * | 1/2017 | Thosteson | F21V 23/003 |
| 2017/0175961 A1 * | 6/2017 | Martin | F21S 4/28 |
| 2017/0254493 A1 | 9/2017 | Giorgini | |
| 2017/0301375 A1 | 10/2017 | Mayhall et al. | |

FOREIGN PATENT DOCUMENTS

| | | | |
|---|---|---|---|
| EP | 2821695 A1 * | 1/2015 | F21K 9/27 |
| EP | 3217090 A1 * | 9/2017 | F21S 8/038 |
| JP | 2016-157700 | 9/2016 | |
| KR | 20110101592 | 9/2011 | |
| KR | 20120021050 A * | 3/2012 | F21S 4/28 |
| WO | WO 2013/090536 | 6/2013 | |
| WO | WO 2017/066642 | 4/2017 | |
| WO | WO 2017/108446 | 6/2017 | |

OTHER PUBLICATIONS

Examination Report issued in Appl. No. EP20205197.5 (dated Jun. 27, 2022).

Extended Search Report issued in Appl. No. EP19808191 (dated Jan. 27, 2022).

Extended Search Report issued in Appl. No. EP20205197.5 (dated Mar. 5, 2021).

* cited by examiner

ELONGATED MODULAR HEAT SINK WITH COUPLED LIGHT SOURCE

CROSS REFERENCE TO RELATED APPLICATIONS

This application is a continuation-in-part under 35 U.S.C. 365(c) of the earlier U.S. Utility patent application entitled "ELONGATED MODULAR HEATSINK WITH COUPLED LIGHT SOURCE LUMINAIRE," Ser. No. 16/672,218, filed Nov. 1, 2019, which is a continuation-in-part of International Patent Application entitled "ELONGATED MODULAR HEATSINK WITH COUPLED LIGHT SOURCE LUMINAIRE," international application number PCT/US19/33152, filed May 20, 2019, which is a Continuation-in-Part of U.S. Utility patent application entitled "HEAT SINK WITH BI-DIRECTIONAL LED LIGHT SOURCE," Ser. No. 16/019,329, filed Jun. 26, 2018, now U.S. Pat. No. 10,502,407, and claims priority to U.S. Provisional patent application to "HEAT SINK WITH BI-DIRECTIONAL LED LIGHT SOURCE," Ser. No. 62/674,431, filed May 21, 2018; and U.S. patent application Ser. No. 16/019,329, filed Jun. 26, 2018, now U.S. Pat. No. 10,502,407, claims priority to U.S. Provisional patent application Ser. No. 62/674,431, filed May 21, 2018. The disclosures set forth in the reference applications are incorporated herein by reference in their entireties.

TECHNICAL FIELD

The present disclosure generally relates to an electromechanical means to connect the elongated heat sink to an array of like heat sinks wherein each of the heat sinks is coupled to at least one light source.

BACKGROUND

Traditional heat sink designs use excessive amount of material and are energy inefficient, resulting in high construction, maintenance, and operation costs. Moreover, traditional heat sinks form factor is not easily scalable, nor adaptable to various mounting heights.

SUMMARY

An array of coupled heat sink modules includes at least two elongated heat sink modules, each elongated heat sink module having at least one of: a unitary coupled fin, a light source, a through bore, electrical conductors disposed inside the through bore, endcap receptacles, a device receptacle, a mechanical joiner, and at least one external power source. The electrical conductors couple to the endcap receptacles at both ends of the elongated heat sink module. The device receptacle mechanically couples to the mechanical joiner. The mechanical joiner mechanically couples to the at least two elongated heat sink modules to establish electrical power connectivity between the at least two elongated heat sink modules, such that power and/or data entering the device receptacle from one of the at least two elongated heat sink modules is conveyed to at least one power consuming device coupled to the device receptacle. Power and/or data from the at least one power consuming device is conveyed through the device receptacle to at least one of: the light source, a device coupled to the device receptacle, and another device receptacle.

An array of coupled heat sink modules includes at least two elongated heat sink modules, each of the at least two elongated heat sink modules having at least one of: a unitary coupled fin, a light source, a through bore, electrical conductors inside the through bore, endcap receptacles, a device receptacle, a mechanical joiner, and at least one external power source. The electrical conductors are disposed inside the through bore and are coupled to the endcap receptacles at both ends of the elongated heat sink module. The device receptacle is mechanically coupled to the mechanical joiner. The mechanical joiner is mechanically coupled to the at least two elongated heat sink modules. An interior wall of the mechanical joiner defines at least one protrusion, wherein the at least one protrusion mechanically aligns one of the at least two elongated heat sink modules with another one of the at least two elongated heat sink modules. The mechanical joiner is secured mechanically to a heat sink by means of coupling a mechanical device through the through bore disposed on the top surface of the mechanical joiner into the heat sink module.

A method includes providing power to a light emitting heat sink array, wherein a device receptacle protrusion is coupled to at least one track inside an inner wall of a mechanical joiner. The track of the mechanical joiner is mechanically gauged by at least one unitary fin coupled to a heat sink module, the mechanical joiner is mechanically coupled to the heat sink module by a mechanical fastener. Upon coupling two opposing heat sink modules to the device receptacle coupled to the mechanical joiner, electrical conductivity is established between the two heat sink modules. A detachable externally mounted power supply is mechanically coupled to the mechanical joiner and electrically coupled to the device receptacle that is coupled to the mechanical joiner, line power flowing through the heat sink bore and the device receptacle reaches the externally mounted power supply, and the power supply is configured to provide power to at least one of: a light source coupled to a heat sink and a device coupled to the device receptacle.

BRIEF DESCRIPTION OF THE DRAWINGS

The detailed description particularly refers to the following figures, in which.

DETAILED DESCRIPTION

A system of the present disclosure describes an electromechanical means to connect the elongated heat sink to an array of like heat sinks wherein each of the heat sinks is coupled to at least one light source.

The elongated heat sink comprises at least one flat longitudinal exterior surface retaining at least one light source, at least one unitary heat dissipating fin coupled to the heat sink's longitudinal exterior surface, a through bore extending from one end of the heat sink's longitudinal axis to the other end, and a power or power and data conductor extending the length of the bore.

The device of the present disclosure couples heat sink receptacles to the power or power and data conductors extending through the bore to the longitudinal ends of the heat sink.

The receptacles are configured to convey power and/or data along an array of coupled heat sinks, eliminating the need for power and/or data conductor circuitry outside the heat sink array. In addition, power and/or data flowing through the receptacle powers externally mounted device/s and enables communication across at least the heat sink's array of devices.

In keeping with the spirit of minimalistic design, the device of the present disclosure includes an electromechanical connector having a minimalistic form and being configured for quick installation and safe connectivity between the elongated heat sinks.

The Heat Sink Array

The heat sink array may extend hundreds of linear feet, eliminating the need for an external power conduit providing power and/or data to luminaires along the path. The heat sink modules' nominal length may range from 2'-0" to 12'-0". It is assumed that the bulk of the module may be used commercially will be 8'-0" or 12'-0" long. The benefits of utilizing long heat sink modules include labor, material, and maintenance cost savings. For example, a heat sink linear array employing 12'-0" long heat sink modules may have power supply units spaced at 48'-0" on center having the power supply/ies' light sources 24'-0" on center in the upstream direction and 24'-0" on center in the downstream direction. In such a configuration, a 200'-0" long array may be configured to have only five power supply units power the light sources and/or the array devices.

FIG. 1 illustrates nominal heat sink modules length and several examples of power and/or data conveyance configuration schemes all based on maximizing the heat sink module spacing. The configuration schemes also illustrate examples of electronic devices that may be coupled to the heat sink array.

The Array Couplers

The heat sink array is formed by coupling a plurality of heat sink modules end to end along their longitudinal axis. The present innovation employs an electromechanical coupler to couple at least two modules of heat sinks. The coupler is comprised of two interlocking elements—the device receptacle and the heat sink joiner. The joiner comes in two types—the plate joiner or the saddle joiner.

The electromechanical coupler and the device receptacle joined together are tasked with:
  mechanically coupling at least two heat sink modules,
  mechanically aligning at least two heat sink modules,
  flowing power and/or data between at least two heat sink modules,
  flowing power to and/or from at least one electrical device to a device receptacle,
  flowing data to and/or from at least one electrical device to a device coupled to the device receptacle, and
  supporting the weight of at least one electrical device coupled to the device receptacle.

Figure 6:
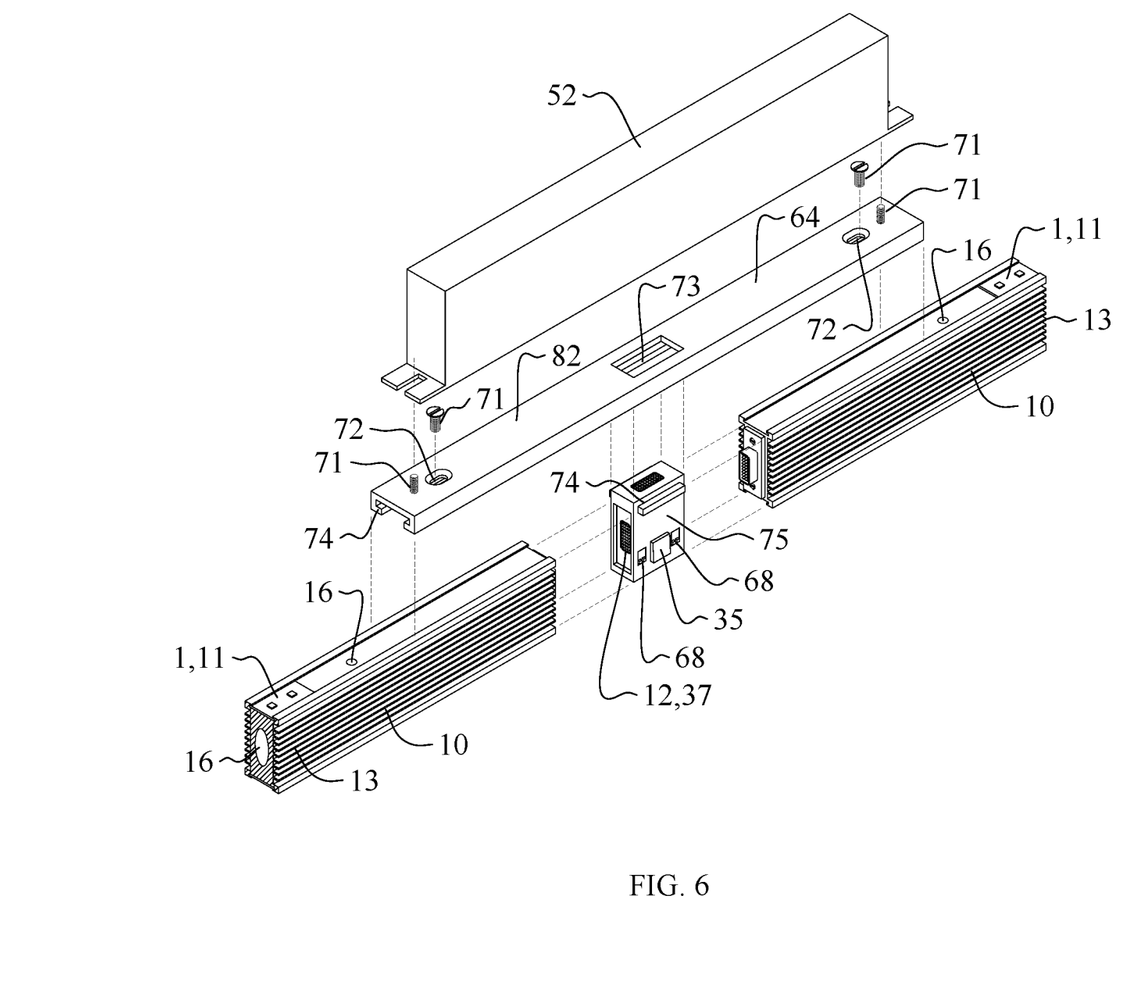
FIG. 6 illustrates an exploded perspective view from above of the heat sink array elements coupled to the plate joiner.
Figure 7:
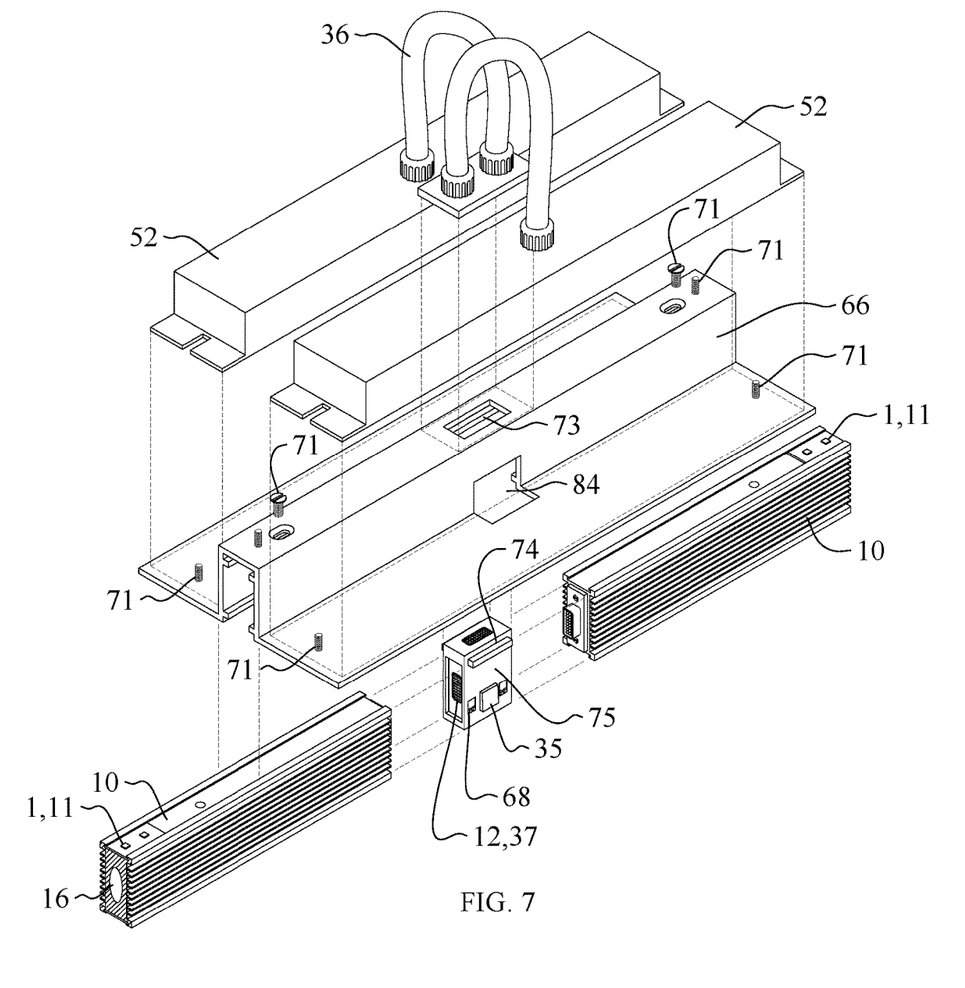
FIG. 7 illustrates an exploded perspective view from above of the heat sink array elements coupled to the saddle joiner.

FIGS. 6 and 7 illustrate exploded perspective views of the heat sink couplers. FIG. 6 illustrates the heat sink coupler plate joiner type from top view. FIG. 7 illustrates the heat sink coupler saddle joiner type from top view. The plate joiner is configured to have an electronic device coupled on its top surface and the saddle joiner is configured to be coupled to electronic devices coupled to a saddle at opposite longitudinal sides of the heat sink array.

The Coupler Devices

The joiner plate and the joiner saddle are configured to be coupled to at least one of: a power supply, a back-up power storage unit, a processor/controller with resident memory and code, and a communication device. In addition, the coupler device may be coupled to sensing and output devices. In other examples, the sensing and output devices may be coupled to the device receptacle that electrically joins the heat sink modules. The devices of the present disclosure may be detachable and may be supplied already coupled to the joiner plate or the joiner saddle.

The Receptacle Device

The receptacle device is configured to flow through power and/or data between a heat sink modules and a plurality of downstream heat sink modules. It is also configured to draw power and/or data to "local" power consuming devices coupled to the device receptacle and nearby coupled devices. Devices coupled in the vicinity include at least one light emitting module. Devices coupled to the device receptacle may include communication, processing/control. Input/out and sensing devices. These devices may be coupled to a universal port configured to couple to uniform device connector that is configured to receive and transmit power and/or data.

Data Processing and Communication

The array of the elongated heat sinks modules may communicatively be coupled to a remote processor and controller and/or be configured to have at least one processor and controller coupled to a device receptacle of the array. Having a local processor reduces demands on a remote processor, avoiding the problem of communication latency. The array may be divided into a plurality of sub-zones with each sub-zone equipped with sensing devices. Input sensed from each sub-zone then may be processed following programmatic parameters, built in logic and remote instruction/s. AI code residing on a local processor may govern the array operation within at least one sub-zone. Having control over sub-zones improves the zones' operational utility and ensures the safety of the sub-zones' occupants. For example, a germ and a bacterial eliminating ultraviolet (UV) light may be coupled to the elongated heat sink along with a light source tasked with ambient illumination. The UV light source is configured to operate when the ambient light source is off. A sensing device may sense the presence of a person approaching the sub-zone illuminated by the UV light sending a signal to the processor. The processor's controller then turns the UV light off and may turn the zone's ambient light on.

The sensing devices may include at least one of: a camera, an occupancy sensor, a daylight sensor, an air quality sensor, and smoke/fire sensor. Output devices may include at least one of: a light source, a sound cancellation device, an audio input/output device, back-up power storage unit and a communication device. The communication across the heat sink array may be wired and/or wireless. In addition, the array devices may in part or in whole be addressable, communicating with neighboring and remote devices. The communication between some of the devices may be direct, bypassing a local and/or remote processor.

The Processor and Code

At least one processor tasked with at least one operation of a device coupled to the heat sink array employs a code. The code may fully reside locally with a processor, or at least in part with a processor. In addition, distributed logic and limited processing capability may be embedded with several of the array devices. Further, the code may reside in the cloud in part and may interface with the array. The code may employ artificial intelligence (AI) algorithms including code that learns the operation within any of the sub-zones having the capacity to improve operational performance over time. The addressable devices coupled to the array operated by AI code may operate based on sensed and communicated inputs, programmatic parameters, and applied logic based on real time local events and specified needs.

The Heat Sink Module

The heat sink module of the present disclosure dissipates substantial amount of heat while generating very high light output having a minimal cross-sectional profile. Symmetrical and/or asymmetrical optical lenses disposed on the light source modules efficiently direct the light emitted toward designated target with minimal waste. In medium and high mounting application the present heat sink array innovation exceeds all other known art when form factor size is measured in relation to light output emitted.

In forming the heat sink array, heat sink modules couple to device receptacles. At both ends of the heat sink module endcaps provide connectivity to the device receptacle. The endcaps receive and/or covey power and/or data being electrically coupled by conductors disposed inside the heat sink module longitudinal bore. The endcaps electrically couple reciprocating receptacles disposed on the exterior face/s of the device receptacle.

The power and/or data connectivity between the heat sink module and the device receptacle power and/or power and data receptacle configure lateral movement due to thermal expansion and is design to allow such movement without breaking electrical connectivity.

Coupling the Heat Sinks

Coupling the heat sinks to form an array may include the following steps:

- sliding a heat sink hanger along a reciprocating track between the heat sink's longitudinally disposed fins,
- securing the heat sink to the structure above by coupling the hanger to above structure,
- verifying that the heat sink mounting height above the floor is as specified,
- inserting the device receptacle into the joiner, squeezing the retractable protrusions, and then lock the retractable protrusions by releasing the pressure, letting the protrusions extend into the coupler's tracks,
- sliding the coupler onto reciprocating tracks between the heat sink fins, and
- securing the coupler to the heat sink by inserting a mechanical fastener through a slotted bore disposed in the coupler's top surface.

The steps to insert the device receptacle into the joiner, slide the coupler onto reciprocating tracks between the heat sink fins, and secure the coupler to the heat sink by inserting a mechanical fastener through a slotted bore disposed in the coupler's top surface may be repeated, coupling another heat sink to the opposing side of the device receptacle coupled to the heat sink.

Upon completing the heat sink array installation, return and populate the linear array with the electrical devices, confirm mounting height and verify heat sink modules alignment.

Complete the installation by coupling the array to conductors of a starter junction box. The conductors may convey power and/or signal.

The heat sink coupler referred herein is an assembly comprising a device receptacle coupled to one of: a plate joiner and the saddle joiner. As such, the heat sink coupler is a two-piece keyed electromechanical coupling device that couples at least two elongated heat sink modules.

The device receptacle:

- conveys power and/or data to onboard and locally (neighboring) coupled device/s,
- conveys through power from an upstream heat sink module to at least one downstream heat sink module,
- conveys data to and from a local array's coupled and remote coupled device/s, and
- enables circuit change from the exterior.

The coupler provides:

- easy access to detachable and externally coupled electronic devices,
- means to align the heat sink array,
- means to mechanically secure the heat sink array assembly, and
- means to allow lateral thermal expansion without breaking electrical connectivity.

The plate joiner and the saddle joiner are coupled to the device receptacle and at least two heat sink modules. By joining the device receptacle to the heat sink modules, electrical connectivity is established between the two heat sinks. Both the plate joiner and the saddle joiner are coupled to electronic devices. The difference between the two joiner types is their capacity to retain different size and count of electronic devices. The plate joiner retains a top mounted device, the saddle joiner retains at least two devices disposed at opposite sides of the heat sinks. The present embodiment is scalable, may be fabricated of metallic or non-metallic material, and may in part be shipped to an installation location pre-assembled.

The heat sink of the present disclosure provides a safe and quick means to couple the heat sink and form a heat sink array having sensing, communication, processing, and output capabilities in real time. The heat sink of the present disclosure minimizes the use of material, the use of energy, and construction/maintenance costs. Being scalable, the present innovation may be configured for all mounting heights, having at least variable light output.

A sliding hanger of the present disclosure enables alignment of the heat sink mounting location with the structure above, eliminating the need to install secondary support structure. Furthermore, this innovation eliminates the need for external power conveyance, having to use at least one rigid conduit alongside the array, feeding power to various luminaires. This innovation is configured to power the coupled devices using conductors to power its devices with power and/or data flowing through a longitudinal bore in the heat sink and through the device receptacle.

Figure 1A:
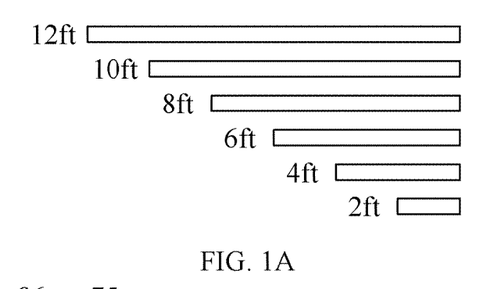
FIG. 1A illustrates typical length of heat sink modules.

FIG. 1A illustrates typical length of heat sink modules and FIGS. 1B, 1C, 1D, 1E and 1F illustrate conceptual circuitry diagrams of several power distribution configurations of the heat sink array. The typical length of heat sink modules conductor 85,86 conveying power and/or data throughout the heat sink array may be shielded. In so doing, local power and through line power may be conveyed through the elongated bore 16 of the heat sink module 10 and through the device receptacle 75 disposed between the heat sink modules 10.

FIG. 1A illustrates typical nominal length of the heat sink modules. The six elongated heat sink modules 10 illustrated below begin with a two-foot section and may grow by increments of two feet, to twelve feet long sections. These heat sink modules 10 may be configured to form an array by coupling same length modules or modules of different length. Regardless of the module length, conductors 85,86 extending inside the module through bore 16 are the same and so are the heat sink 10 receptacles 37 disposed at the end of the heat sink's elongated ends that couple to the conductors 85,86.

Figure 1B:
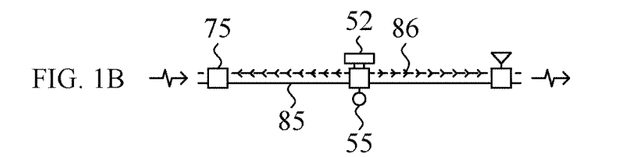
FIGS. 1B, 1C, 1D, 1E, 1F, and 1G illustrate conceptual circuitry diagrams of several power distribution configurations of the heat sink array.

FIG. 1B illustrates a through power and/or data conductor 85 (in solid line) entering a device receptacle 75, exiting on the other side, continuing to the next device receptacle 75 where the power and/or data conductor/s 85 split/s wherein at least one conductor rises through the device receptacle 75 to a power supply 52 unit and/or another electronic device 62, while the other conductor continues through to the next device receptacle 75, exiting on the other side of the device receptacle 75 and continuing repeating the same or similar pattern downstream. The device receptacle 75 illustrated coupled to the power supply 52 is illustrated also coupled to a camera 55 from below.

Line power arriving at a power supply 52 is transformed into voltage power needed to energize at least one electronic device 62 coupled to the device receptacle 75 and/or local heat sink modules. In FIG. 1B, the device is a light source 1 is longitudinally disposed along the heat sink module 10 with the power line is illustrated in dashed line 86. FIG. 1B illustrates two heat sink modules 10 with the power supply 52 disposed in the middle and the camera 55 below having through power conductor 85 extending from end to end and local power conductor 86 extending in opposite direction of the power supply 52 providing power and/or data to the two coupled heat sink modules 10.

Figure 1C:
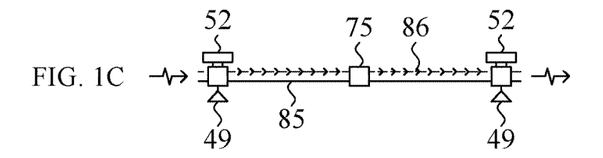

FIG. 1C illustrates the same power conveyance for the through line power as FIG. 1B. Power for the local device/s extends from the upstream power supply 52 to both heat sink modules 10. Other elements illustrated include device receptacles 75 and occupancy sensors 49 coupled from below to two of the three illustrated.

Figure 1D:
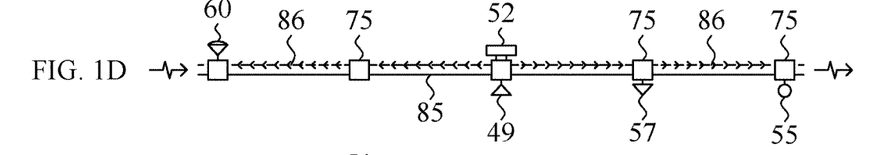

FIG. 1D illustrates a similar power conveyance configuration as FIG. 1B with the local conductor 86 originating with the power supply 52 extending through the device receptacle 75 to an additional coupled elongated heat sink 10 through a device receptacle 75. This configuration may employ the saddle joiner 66 having two power supplies 52, each supplying power in opposite direction to two heat sink modules 10. In this configuration, using 12'-0' heat sink modules 10, the local power conveyed may power the 48'-0" linear feet of electronic device/s 62. Elements illustrated include audio device 60, the camera 55, wireless communication device 57 and an occupancy sensor 49.

Figure 1E:
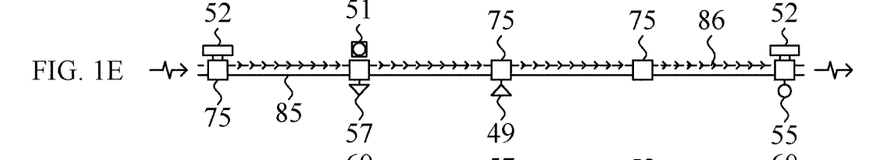

FIG. 1E illustrates a wiring configuration similar to that of FIG. 1C where the local power 86 originating with the power supply 52 is conveyed downstream through four heat sink modules 10 and three device receptacles 75. Elements illustrated include audio device 60, the camera 55, a processor 51, a wireless communication device 57 and an occupancy sensor 49.

Figures 1F, 1G:
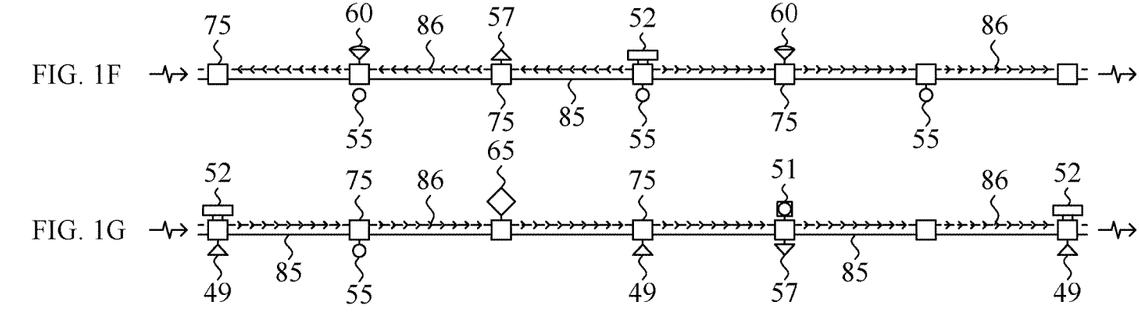

FIG. 1F illustrates a similar configuration to FIG. 1D. FIG. 1F employs a saddle joiner 66 having at least two power supplies 52 powering input/output devices coupled to the elongated heat sink 10 and the device receptacles 75. One power supply may power downstream devices and the other upstream devices. Elements illustrated in FIG. 1F include audio device 60, the camera 55, a processor 51, a wireless communication device 57 and an occupancy sensor 49.

FIG. 1G illustrates a similar configuration to that of FIG. 1E. The configuration of FIG. 1G, like the configuration of FIG. 1E, may employ a saddle joiner 66. In this configuration, the upstream and downstream power delivered by the at least two power supplies 52 may extend up to 36'-0" in each direction resulting in power supply 52 device spacing of 72'-0" on center. The power supply 52 may have at least two circuits and so may the device receptacles 75. The device receptacles 75 may have dip switches 68 to control the circuits and direct the power to selected electronic devices 62 coupled to the heat sink 10 and the device receptacle/s 75. Elements illustrated in FIG. 1G include audio device 60, the camera 55, a processor 51, a wireless communication device 57, an occupancy sensor 49 and other sensing device 65.

Figures 2A, 2B:
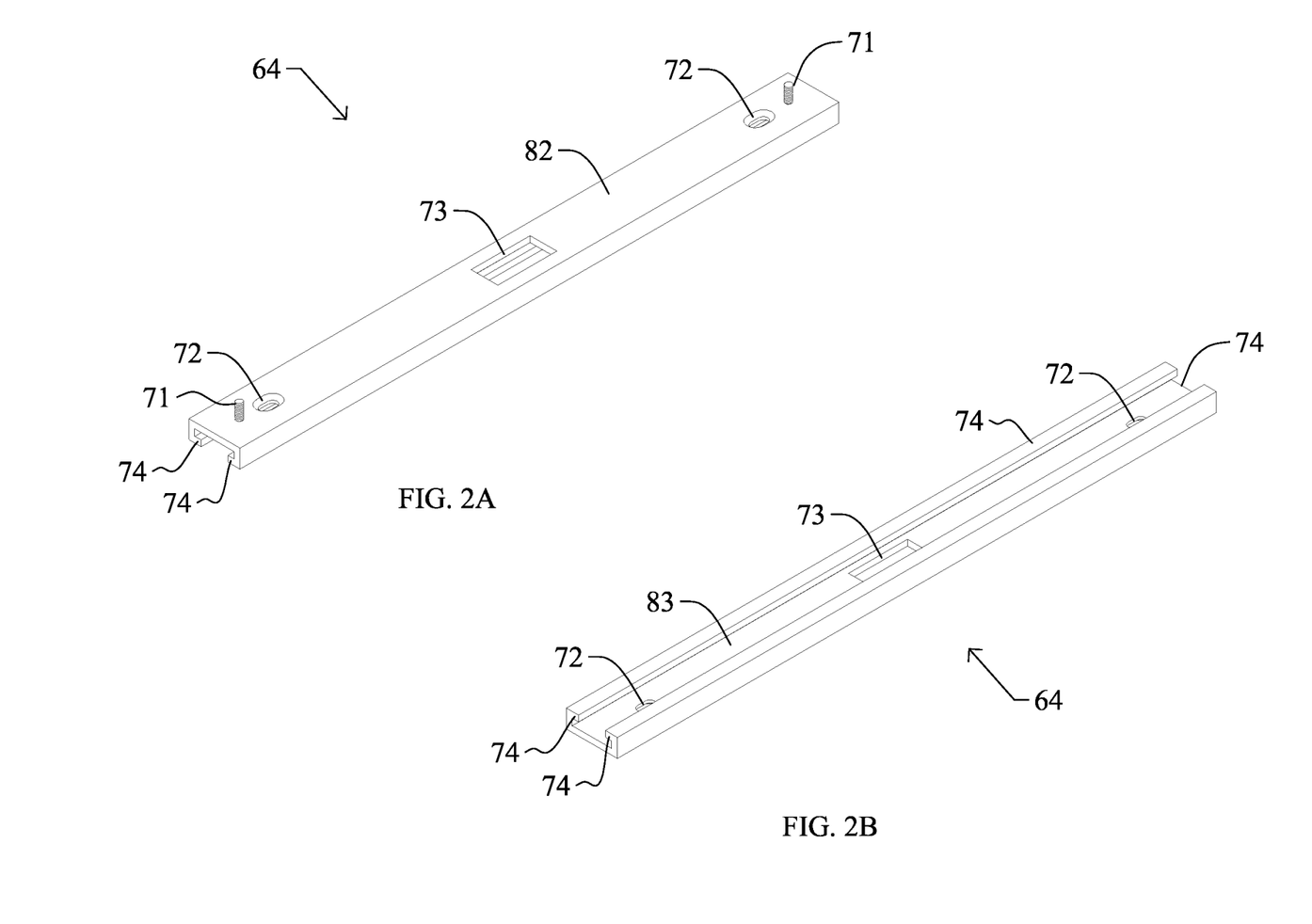
FIGS. 2A and 2B illustrate perspective views of the plate joiner.

FIGS. 2A and 2B illustrate perspective views of the plate joiner. FIG. 2A illustrates the top view of the plate joiner 64. The plate is an inverted elongated "U" shaped bar with two legs extending downward having at least one continuous mechanical protrusion 74 in each leg inner wall. The mechanical protrusion 74 slides along continuous tracks disposed in the elongated heat sink 10 exterior surfaces (not shown). The plate joiner 64 has a keyed opening 73 at the center of the top surface 82. The device receptacle 75 coupled from below, fills in the void in the keyed joiner opening 73. The top perimeter enclosure of the device receptacle 75 is mechanically keyed to engage the keyed joiner opening 73.

At both ends of the plate joiner 64 slotted bores 72 are configured to receive mechanical fasteners 71 coupling the plate joiner 64 to heat sink modules 10. The fasteners 71 inside the slotted bore 72 allow lateral heat sink 10 movement due to thermal expansion. The lateral movement is to occur without breaking electrical connectivity. Next to the slotted bores 72, protruded mechanical fastener 71 are configured to secure an electronic device 62 to the plate joiner 64.

The electronic device 62 is mechanically coupled to the plate joiner 64 and secured to the mechanical fasters 71. The plate joiner 64 mechanically and electrically is coupled to the device receptacle 75. The plate joiner 64 is also mechanically coupled and secured by fasteners 71 to heat sink modules 10 having tracks in the heat sinks 10 exterior surfaces. The tracks are mechanically engaged by the plate joiner 64 mechanical protrusion 74. As the assembly elements couple, power and/or data flows from one heat sink module 10 through the device receptacle 75 to at least one of: heat sink module 10 and an electronic device 62 coupled to a device receptacle 75.

FIG. 2B illustrates the bottom view of the plate joiner 64. The elongated "U" shaped bar illustrates at the center of its elongated body a keyed joiner opening 73. This keyed opening receives the top perimeter of the device receptacle 75. Unitary coupled legs extend upwardly from the sides of the plate joiner 64. Mechanical protrusion 74, unitary coupled to the legs, extend inwardly purposed to partially or fully embrace at least one of: the device receptacle 75 and a heat sink module 10. The mechanical protrusion 74 slides under continuous track disposed along the elongated heat sink 10 exterior surfaces (not shown).

The mechanical protrusion 74 also mechanically engages the device receptacle 75. The device receptacle 75 is inserted in from below by applying pressure on at least one latch 35 disposed on the device receptacle 75 body. The pressure retracts the device's mechanical protrusion 74. The pressure on the latch 35 is released when the top of the device receptacle 75 is in position inside the keyed joiner opening 73. At both ends of the plate joiner 64 at least one slotted bore 72 is configured to allow lateral heat sink 10 movement due to thermal expansion. The movement due to thermal expansion is to occur without breaking electrical connectivity.

Figures 3A, 3B:
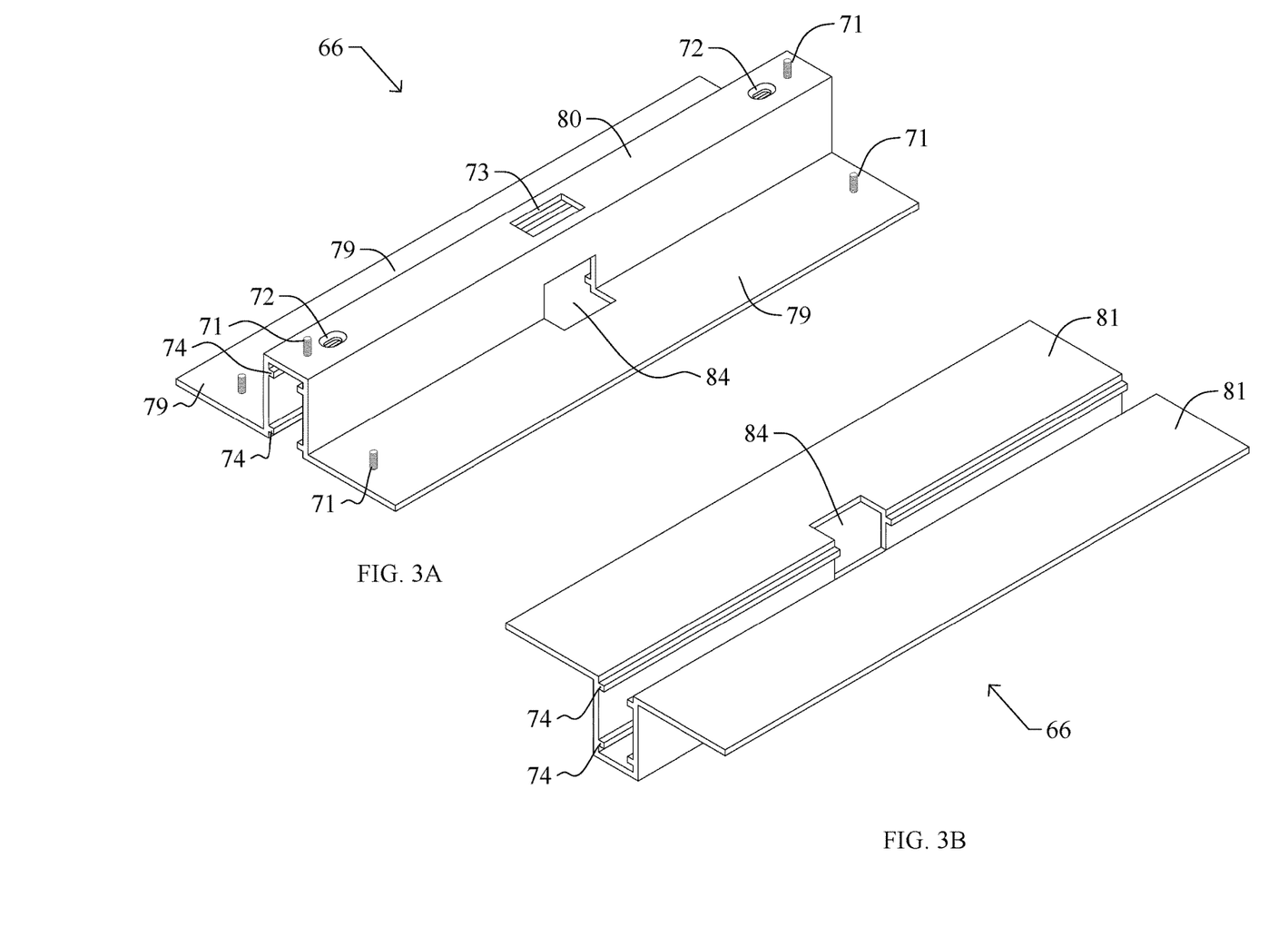
FIGS. 3A and 3B illustrate perspective views of the saddle joiner.

FIGS. 3A and 3B illustrate perspective views of the saddle joiner. FIG. 3A illustrates the top view of the saddle joiner 66. The saddle joiner 66 is an elongated bar with two vertical legs extending downward coupling to two horizontal device mounting surfaces 79. At least one of: a device receptacle 75 and heat sink module 10 embodiments are partially or fully disposed inside the saddle joiner 66 vertical legs. At least one continuous mechanical protrusion 74 is unitarily coupled in each of the saddle joiner 66 inner leg walls.

The mechanical protrusion 74 slides on a continuous track disposed in the elongated heat sink module 10 exterior surfaces (not shown). The saddle joiner 66 has a keyed opening 73 at the center of the top surface 80. The device receptacle 75, coupled from below, fills the keyed joiner opening 73 void. The top perimeter enclosure of the device receptacle 75 is mechanically keyed to engage the keyed saddle joiner opening 73.

At both ends of the saddle joiner 66 slotted bores 72 are configured to receive mechanical fasteners 71 coupling the saddle joiner 66 to heat sink modules 10. The fasteners 71 inside the slotted bore 72 allow lateral heat sink module 10 movement due to thermal expansion. The lateral movement is to occur without breaking electrical connectivity. Next to the slotted bores 72, optional protruded mechanical fasteners 71 are configured to secure an electronic device 62 to the saddle joiner 66. On both sides of the saddle joiner 66 two horizontal device mounting surfaces 79 extend outward from the saddle joiner 66 vertical legs. These horizontal plates 79 are configured to retain a plurality of electronic devices 62 including at least one power supply 52. The electronic device/s 62 are coupled to the device mounting surfaces 79 by mechanical fasteners 71 that may be disposed at the top of the mounting surface 79 opposing ends.

At least one electronic device 62 is mechanically coupled to the saddle joiner 66 device mounting surface/s 79, 81 and secured to saddle joiner 66 by mechanical fasters 71. The saddle joiner 66 mechanically and electrically is coupled to the device receptacle 75. The saddle joiner 66 is also mechanically coupled and secured by fasteners 71 to heat sink modules 10 having tracks in the heat sinks 10. The tracks mechanically engaged the saddle joiner 66 mechanical protrusion 74. As the assembly elements couple, power and/or data flows from one heat sink module 10 through the device receptacle 75 to at least one of: heat sink module 10 and an electronic device 62 coupled to a device receptacle 75.

FIG. 3B illustrates the bottom view of the saddle joiner 66. The saddle joiner 66 is an elongated bar with two vertical legs extending downward coupling to two horizontal device mounting surfaces 79. At least one of: a device receptacle 75 and a heat sink module 10 are partially or fully disposed inside the saddle joiner 66 vertical legs. At least one continuous mechanical protrusion 74 is unitarily coupled in each of the saddle joiner 66 inner leg walls.

The mechanical protrusion 74 slides on a continuous track disposed on the elongated heat sink 10 exterior surfaces (not shown). The saddle joiner 66 has a keyed opening at the center of the top surface 80. The device receptacle 75 coupled from below, fills the keyed joiner opening 73 void (not shown). The top perimeter enclosure of the device receptacle 75 is mechanically keyed to engage the keyed saddle joiner opening 73. On both sides of the saddle joiner 66 the bottom surface of two horizontal device mounting surfaces 79 are illustrated extending outward from the saddle joiner 66 vertical legs.

The bottom face of the device mounting surfaces 81 may also be configured to retain a plurality of electronic devices 62 including at least one power supply 52. The electronic device/s 62 may be coupled to mounting surfaces 81 below and 79 above by mechanical fasteners 71 that may be disposed at the top and/or bottom surface/s of the electronic device mounting surface/s 79,81 opposing sides of heat sink modules 10. In addition, optional mechanical fasteners 71, are configured to secure at least one electrical device to the saddle joiner 66 at the top surface 80 of the saddle joiner 66 next to the slotted bores 72.

At least one electronic device 62 is mechanically coupled to the saddle joiner 66 device mounting surface/s 79, 81 and secured to saddle joiner 66 by mechanical fasters 71. The saddle joiner 66 mechanically and electrically is coupled to the device receptacle 75. The saddle joiner 66 is also mechanically coupled and secured by fasteners 71 to heat sink modules 10 having tracks in the heat sinks 10. The tracks mechanically engaged the saddle joiner 66 mechanical protrusion 74. As the assembly elements couple, power and/or data flows from one heat sink module 10 through the device receptacle 75 to at least one of: heat sink module 10 and an electronic device 62 coupled to a device receptacle 75.

Figure 4:
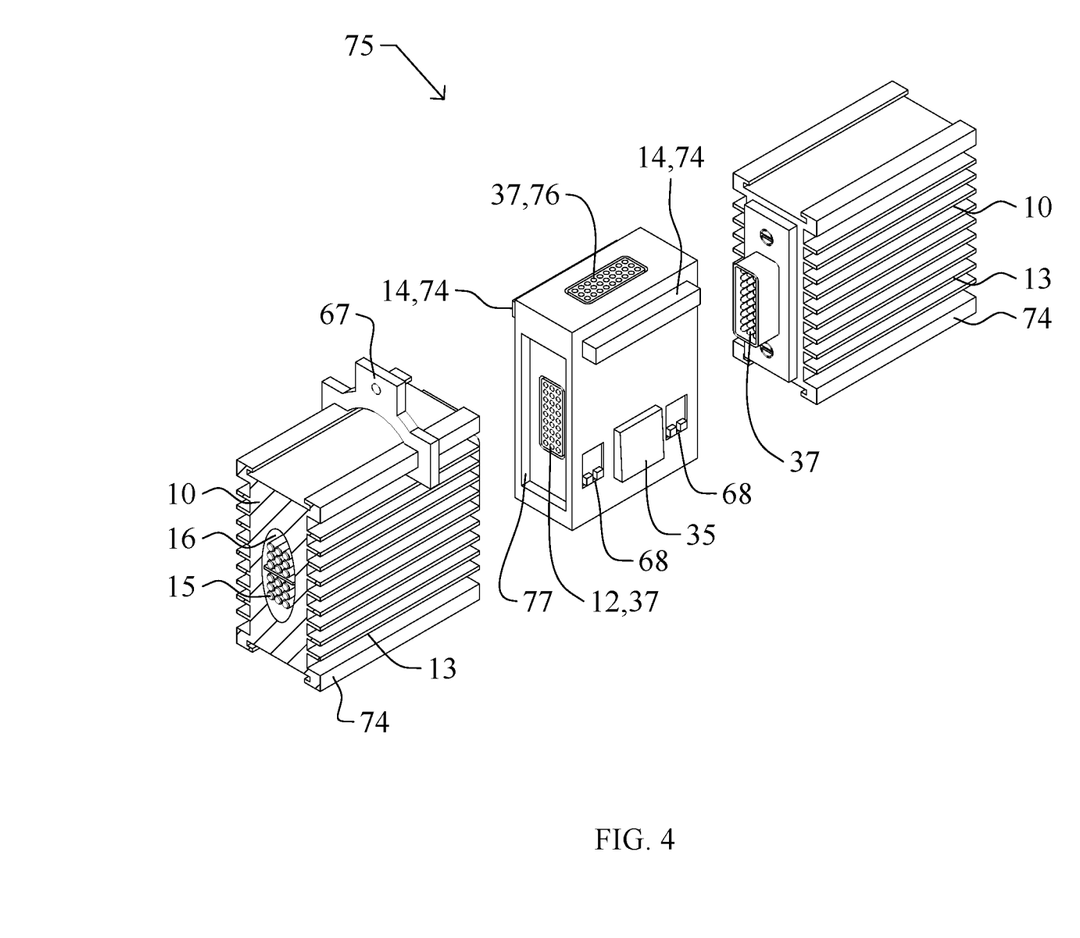
FIG. 4 illustrates a perspective view of the device receptacle.

FIG. 4 illustrates a perspective view of the device receptacle 75 with partial views of heat sink modules 10 longitudinally disposed at opposite sides of the device receptacle 75. The device receptacle 75 is an electrical element of the heat sink 10 array. Its functionalities include at least one of: power and/or data connectivity to and from coupled electronic device/s 62 and power and/or data connectivity between a heat sink 10 and at least one neighboring heat sink 10 coupled to the same device receptacle 75. In so doing, the device receptacle 75 provides continuous through power or power and data across the heat sink 10 array. The device receptacle 75 is a mechanical element that forms the heat sink 10 array. The device receptacle couples mechanically to the plate 64 and the saddle 66 joiners which in turn couple to the heat sink modules 10. The assembly is hung by the heat sink hangers 67. The electronic device/s 62 are coupled to the saddle joiner 66 and together the assembly forms the heat sink 10 array.

The device receptacle 75 is configured to receive power from an upstream source, distributing the power to a downstream heat sink module/s 10. The power received and/or distributed through the device receptacle 75 is at least one of: line power and low voltage power. The power and/or data conductor 61 may have different gage and protected by shielding. In addition, the device receptacle 75 may have at least one top and/or bottom power or power and data receptacle/s 37, 76. The receptacle/s 37, 76 are configured to couple to at least one electrical device 62. The electrical device 62 may include a power I/O and management device 52, a communication device 57, a processing/controlling device 51, and a sensing device 65.

For example, line power conveyed from the device receptacle 75 to a coupled power I/O and power management device 52 is converted to specific voltage and conveyed back through the device receptacle 75 to at least one light source 1 disposed on a coupled heat sink 10. In addition, same or other power device/s 52 coupled to the device receptacle 75 may convey processed power to the device coupled receptacle 37, 76 and/or to neighboring device receptacle/s 37, 76.

The electronic devices 62 may also draw power through the receptacles 37, 76 directly from the through line voltage power of the heat sink 10 array device receptacles 75. A dip switch 69 feature controlling a plurality of circuits may be configured to operate the device receptacle 75 electrical and/or data circuits. The present figure illustrates the dip switches 69 disposed on both sides of the release button/latch 35. Data may flow internally through wires disposed inside the heat sink 10 through bores 16 and the device receptacle 75. In addition, the data may be received and/or communicated wirelessly by at least one device 62 coupled to the device receptacle 75.

In another example, at least one circuit can be switched by relaying an instruction through at least one communication device.

Both the power and data receptacles 37, 76 of the device receptacle 75 are configured to permit lateral movement between the device receptacle 75 and the coupled heat sink modules 10 to allow thermal expansion without breaking the electrical connectivity.

The device receptacle 75 is coupled to the plate 64 or the saddle 66 joiner. At both sides and toward the top of the device receptacle 75 retractable mechanical keyed protrusions 14, 74 couple the device receptacle 75 to the joiner 64, 66. The protrusion 14, 74 is a linear bar configured to engage a track or a flat surface inside the inner walls of the joiner 64, 66. The protrusion 14, 74 may be retracted by applying pressure on the release button/latch 35 from both sides. To couple the device receptacle 75 to a joiner 64, 66, one has to apply pressure on the release button/latch 35 and then from below insert the device receptacle 75 top surface into the joiner's keyed joiner opening 73 and then release the pressure. Once the pressure is released, the device receptacle 75 is locked in position. The present latching configuration illustrated is an example of several possible configurations to couple the device receptacle 75 to a joiner 64, 66.

Figure 5A:
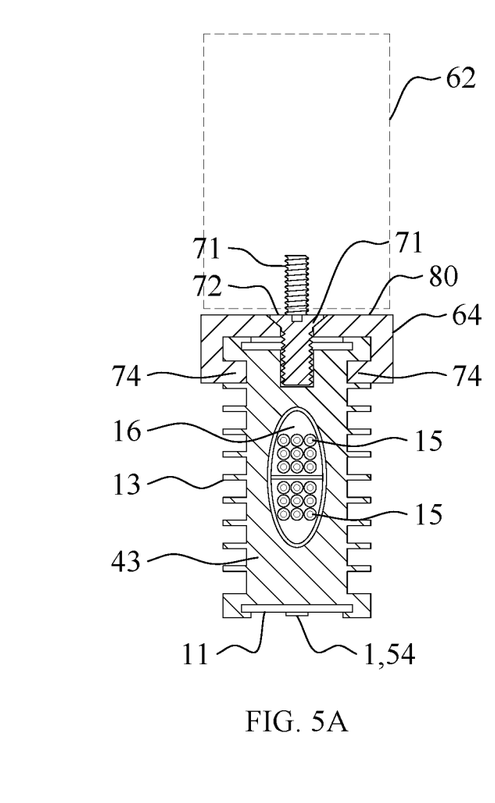
FIGS. 5A and 5B illustrate transverse cross-section views of the heat sink assembly, plate joiner, and saddle joiner.
Figure 5B:
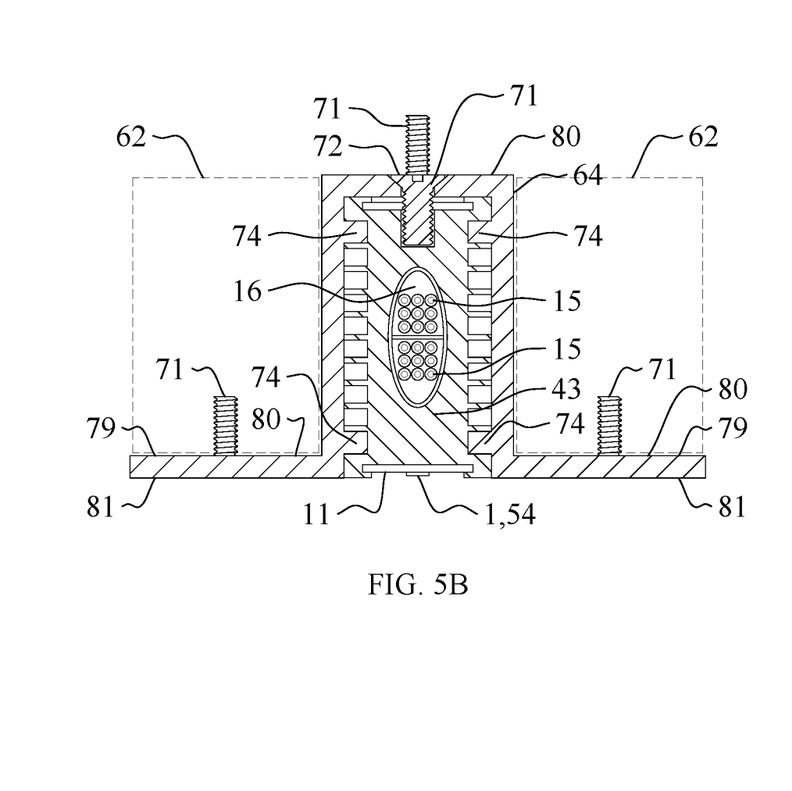

FIGS. 5A and 5B illustrate transverse section views across the plate joiner and the saddle joiner respectively both coupled to a heat sink. FIG. 5A illustrates a transverse section through the plate joiner 64 coupled to a heat sink module 10. The section cuts across a slotted bore 72 in the heat sink module 10. A mechanical fastening device 71 inserted from above into a slotted bore 72 of the plate joiner 64 top surface 80 secures the plate joiner 64 to the heat sink 10. The purpose of the slotted bore 72 is to allow thermal expansion of the continuous heat sink 10 array without disrupting the through power or power and data connectivity. In this embodiment, the elongated joiner 64 is shaped as an inverted letter "U" having two unitarily formed protrusions 74 extending from the plate joiner 64 legs inwardly. The protrusions 74 slide inside and along at least two tracks disposed between the top surface of the heat sink 10 and heat dissipating fins 13 below. The joiner plate 64 couples and aligns heat sink modules 10. In so doing, power and/or data conveyed through the heat sink module 10 endcap receptacle 12 flows through the device receptacle 75 and conveyed to at least one other heat sink module 10.

At least one electronic device 62 is mechanically fastened to the top surface 80 of the plate joiner 64. The device may have a power or power and data receptacle that electrically couples the electronic device 62 to the device receptacle 75 that is also coupled to the plate joiner 64. A heat sink module 10 coupled to the plate joiner 64 in this figure illustrates power or power and data conductors 15 inside a longitudinal bore 16 in the heat sink 10 and a light source module 11 coupled to the bottom of the heat sink 10.

The plate joiner 64 joins at least two heat sink modules 10 by coupling them to a device receptacle 75 disposed between. Through mechanical coupling of the two heat sink modules 10 to the device receptacle 75, power or power and data connectivity between the two heat sink modules 10 is established.

FIG. 5B illustrates a transverse section view through the saddle joiner 66 coupled to a heat sink module 10. The section cuts across a slotted bore 72 in the heat sink module 10. A mechanical fastening device 71 inserted from above into a slotted bore 72 of the saddle joiner 66 top surface 80 secures the saddle joiner 66 to the heat sink 10. The purpose of the slotted bore 72 is to allow thermal expansion of the continuous heat sink module 10 array without disrupting the through power and/or data connectivity. In this embodiment, the elongated joiner 66 is shaped as an inverted letter "U" having two horizontal surfaces extending outward from the vertical legs of the inverted "U" shaped embodiment. At least one continuous unitary fabricated protrusion 74 is/are coupled to the inner face of each of the saddle joiner 66 legs. The protrusion/s mechanically 74 engage/s tracks formed between unitary formed heat dissipating fins 13 disposed between the top and bottom surfaces of a heat sink module 10. The protrusions 74 slide inside and along at least two tracks providing precise alignment between two linear heat sink modules 10 coupled to the device receptacle 75.

At least one electronic device 62 is mechanically fastened to the saddle device mounting surface 79 of the saddle joiner 66. The device 62 power or power and data connector couples to the device receptacle 75. In this figure, the heat sink module 10 is coupled to the saddle joiner 66 illustrates power or power and data conductors 15 inside a longitudinal bore 16 disposed in the heat sink 10 core 43 and a light source module 11 coupled to the bottom of the heat sink 10.

The saddle joiner 66 joins at least two heat sink modules 10 by coupling them to a device receptacle 75. Power or power and data connectivity between the two heat sink modules 10 is established through mechanical coupling of the two heat sink modules 10 to the device receptacle 75.

FIG. 6 illustrates an exploded perspective from above of a module of the heat sink 10 array employing the plate joiner 64. From above to below the elements illustrated include an electrical device 52, a plate joiner 64, a device receptacle 75 and partial views of two heat sink modules 10 disposed at opposite ends of the device receptacle 75.

The device receptacle 75 is coupled to the plate joiner 64 from below. In this figure, coupling the device receptacle 75 to the plate joiner 64 entails applying pressure on the release button/latch 35 to retract the protrusions 74, illustrated at proximity to the top of the device receptacle, placing the top end of the device receptacle 75 inside the keyed joiner opening 73 and releasing the button letting the protrusion 74 mechanically engage the tracks inside the plate joiner 64. Once engaged, heat sink modules 10 are laterally inserted sliding into and along the mechanical protrusions 74 of the plate joiner 64. The heat sink modules 10 slide along the tracks until their endcaps 12 couple to the device receptacle 75. Then, a mechanical fastener 71 inserted from above through a slotted bores 72 of the plate joiner 64 secures the plate joiner 64 to the heat sink modules 10.

The process may be repeated, as needed, to form the heat sink 10 array adding electronic devices 52 to the device receptacle 75 bottom and top surface receptacle 37,76. A dip switch 68 bank disposed next to the button/latch 35 of the device receptacle 75 enables controlling the power and/or data circuits entering and existing the device receptacle 75. The array is hung from above by hangers 67 (see FIG. 4). The hangers 67 may travel laterally along the heat sink's 10 longitudinal lengths engaged inside tracks formed between the heat dissipating fins 13 of the heat sink 10. Mobility of the hanger 67 reduces the need to erect a support structure. In particular, the hanger 67 may be vertically aligned with a structural member above and may be coupled to a structure by an aircraft cable, chain, or pendant.

FIG. 7 illustrates an exploded perspective view of an array of heat sink modules 10 coupled to the saddle joiner 66. The elements illustrated include electrical devices 52, electrical flexible conduits 36, a saddle joiner 66, a device receptacle 75 and partial views of two heat sink modules 10 disposed at opposite ends of the device receptacle 75.

The device receptacle 75 is coupled to the saddle joiner 66 from below. In FIG. 7, coupling the device receptacle 75 to the plate joiner 66 entails applying pressure on the release button/latch 35 to retract the protrusions 74, illustrated at proximity to the top of the device receptacle, placing the top end of the device receptacle 75 inside the keyed joiner opening 73 and releasing the button letting the protrusion 74 mechanically engage the tracks inside the plate joiner 64. Once engaged, heat sink modules 10 are laterally inserted sliding into and along mechanical protrusions 74 extending inwardly from both legs of the saddle joiner 66. The heat sink modules 10 slide along the track until their endcaps 12 couples the device receptacle 75. A mechanical fastener 71 inserted from above through a slotted bores 72 of the saddle joiner 66 secures the saddle joiner 66 to the heat sink modules 10.

The process may be repeated, as needed, to form the heat sink 10 array adding electronic devices 52, to the device receptacle 75 on its bottom and top surfaces. A dip switch 68 bank disposed on the side of the device receptacle 75 enables controlling the power and/or data circuits entering and existing the device receptacle 75. The array is hung from above by hangers 67 (see FIG. 4). The hangers 67 may travel laterally along the heat sink's 10 longitudinal lengths engaged inside tracks formed between the heat dissipating fins 13 of the heat sink 10. The hanger's 67 mobility reduces the need to erect a support structure, the hanger 67 may be vertically aligned with a structural member above and be coupled to structure by an aircraft cable and/or a chain.

While the concepts of the present disclosure are susceptible to various modifications and alternative forms, specific exemplary embodiments are been illustrated by way of example in the drawings and will be described. It should be understood, however, that there is no intent to limit the concepts of the present disclosure to the particular forms disclosed; on the contrary, the intention is to cover all modifications, equivalents, and alternatives falling within the spirit and scope of the invention as defined by the appended claims.

References in the specification to "one embodiment," "an embodiment," "an illustrative embodiment," etc., indicate that the described embodiment may include a particular feature, structure, or characteristic, but every embodiment may or may not necessarily include that particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to effect such feature, structure, or characteristic in connection with other embodiments whether or not explicitly described. Additionally, it should be appreciated that items included in a list in the form of "at least one A, B, and C" can mean (A); (B); (C): (A and B); (B and C); (A and C); or (A, B, and C). Similarly, items listed in the form of "at least one of A, B, or C" can mean (A); (B); (C): (A and B); (B and C); (A and C); or (A, B, and C).

The disclosed embodiments may be implemented, in some cases, in hardware, firmware, software, or any combination thereof. The disclosed embodiments may also be implemented as instructions carried by or stored on one or more transitory or non-transitory machine-readable (e.g., computer-readable) storage medium, which may be read and executed by one or more processors. A machine-readable storage medium may be embodied as any storage device, mechanism, or other physical structure for storing or transmitting information in a form readable by a machine (e.g., a volatile or non-volatile memory, a media disc, or other media device).

In the drawings, some structural or method features may be illustrated in specific arrangements and/or orderings. However, it should be appreciated that such specific arrangements and/or orderings may not be required. Rather, in some embodiments, such features may be arranged in a different manner and/or order than illustrated in the illustrative figures. Additionally, the inclusion of a structural or method feature in a particular figure is not meant to imply that such feature is required in all embodiments and, in some embodiments, may not be included or may be combined with other features.

While the disclosure has been illustrated and described in detail in the drawings and foregoing description, such an illustration and description is to be considered as exemplary and not restrictive in character, it being understood that only illustrative embodiments have been illustrated and described and that all changes and modifications that come within the spirit of the disclosure are desired to be protected.

There are a plurality of advantages of the present disclosure arising from the various features of the method, apparatus, and system described herein. It will be noted that alternative embodiments of the method, apparatus, and system of the present disclosure may not include all of the features described yet still benefit from at least some of the advantages of such features. Those of ordinary skill in the art may readily devise their own implementations of the method, apparatus, and system that incorporate one or more of the features of the present invention and fall within the spirit and scope of the present disclosure as defined by the appended claims.

The invention claimed is:

1. A device comprising:
  an array of elongated heatsink modules, each heatsink module of the array is unitary fabricated and displays a solid heatsink core with a longitudinal opening extending through the heatsink core from one end of the heatsink core to the other end, and includes a plurality of heat dissipating fins unitarily coupled to the heatsink core;
  a plurality of light sources, with a light source of the plurality of light sources respectively coupled to an exterior surface of each heatsink core;
  at least one conductor that extends a length of the longitudinal opening in the core of each of the heatsinks; and
  a device receptacle that electrically and mechanically couples at least two of the heatsink modules and conveys at least one of power or data between the at least two of the heatsink modules, wherein a portion of heat generated by the plurality of light sources is conveyed through the heatsink core of each of the heatsink modules directly to most of the plurality of the heat dissipating fins.

2. The array of claim 1, wherein the mechanical joiner includes at least one of a plate joiner and a saddle joiner.

3. The array of claim 1, further comprising at least one of: a processor/controller, a communication device, a sensing device, and an output device is/are coupled to the device receptacle.

4. The array of claim 1, further comprising at least one detachable device that is coupled mechanically and/or electrically to the device receptacle.

5. The array of claim 1, wherein the device receptacle includes a plurality of power or power and data circuits.

6. The array of claim 1 further comprising at least one dip switch that controls at least one of: the power and data circuits of the device receptacle.

7. The array of claim 1, wherein at least one receptacle of the device receptacle is universal and is configured to power at least two devices of different functionality.

8. The array of claim 1, wherein at least one of the electrical conductors entering and/or existing the device receptacle is shielded.

9. The array of claim 1, wherein power or power and data from a coupled device is/are conveyed through the device receptacle upstream and/or downstream through at least one longitudinal opening in one of the at least two coupled elongated heat sink modules.

10. A device comprising:
an array of elongated heatsink modules, each heatsink module of the array is unitary fabricated and displays a solid heatsink core with a longitudinal opening extending through the heatsink core from one end of the heatsink core to the other end, and includes a plurality of heat dissipating fins unitarily coupled to the heatsink core;
a plurality of light sources, with a light source of the plurality of light sources respectively coupled to an exterior surface of each heatsink core;
at least one conductor that extends a length of the longitudinal opening in the core of each of the elongated heatsink modules; and
a device receptacle that electrically and mechanically couples to the at least one conductor of at least two of the elongated heatsink modules, and a mechanical joiner that couples the device receptacle to at least one externally coupled power source, wherein
a portion of heat generated by the plurality of light sources is conveyed through the core of each of the at least two of the elongated heatsink modules directly to most of the plurality of the heat dissipating fins, and
an interior wall of the mechanical joiner defines at least one protrusion that mechanically aligns one of the at least two elongated heatsink modules with another one of the at least two elongated heatsink modules, wherein the mechanical joiner is mechanically fastened to at least one of the two heat sink modules, and the at least one externally coupled power source coupled to the mechanical joiner supplies power to at least one of: a heatsink and/or device receptacle power consuming device.

11. The array of claim 10, wherein a slotted bore in the mechanical joiner is configured to allow array thermal expansion without disrupting through power connectivity.

12. The array of claim 10, wherein the mechanical joiner is configured to interlock with a device receptacle.

13. The array of claim 10, wherein a mechanical connector disposed on the top surface of the mechanical joiner is configured to couple to at least one electrical device.

14. The array of claim 10, wherein at least one electrical device is disposed alongside a coupled heat sink array.

15. The array of claim 10, wherein the mechanical joiner and/or the heat sink is fabricated of a metallic material.

16. The array of claim 10, wherein the mechanical joiner and/or the heat sink is fabricated of a non-metallic material.

17. The array of claim 10, wherein longitudinal tracks in the heat sink module are disposed between at least two unitary longitudinal fins and couple to at least one of: a joiner and a hanger.

18. The array of claim 17, wherein the hanger coupled to at least one heat sink fin is free to travel longitudinally along the heat sink and couple to the structure above.

19. The array of claim 17, wherein the at least one coupled device is electronically addressable by means of at least one of: wired and wireless communication.

20. The array of claim 10, wherein electrical current from an external detachable power supply flows through the at least one conductor and the device receptacle and then from the device receptacle to at least one of a light source coupled to the heat sink and a device coupled to the device receptacle.

21. A method comprising:
providing power to plurality of light sources coupled to an array of elongated heatsink modules,
each heatsink module of the array is unitary fabricated and displays a solid heatsink core with a longitudinal opening extending through the heatsink core from one end of the heatsink core to the other end, and includes a plurality of heat dissipating fins unitarily coupled to the heatsink core,
each light source of the plurality of light sources being coupled to an exterior surface of a corresponding heatsink core,
at least one conductor that extends a length of the longitudinal opening in the core of each of the heatsinks, and
a device receptacle that electrically and mechanically couples at least two of the heatsink modules;
generating light from the plurality of light sources;
generating heat from the plurality of light sources, and conveying a portion of the heat through the heatsink core of each of the heatsink modules directly to most of the plurality of the heat dissipating fins;
providing via the device receptacle between the at least two elongated heatsink modules at least one of power or data between the at least two elongated heatsink modules.

* * * * *